United States Patent
Salami et al.

(10) Patent No.: US 10,563,079 B2
(45) Date of Patent: Feb. 18, 2020

(54) SILVER NANOPARTICLE INK

(71) Applicant: Xerox Corporation, Norwalk, CT (US)

(72) Inventors: Pedram Salami, Toronto (CA); Ping Liu, Mississauga (CA); C. Geoffrey Allen, Waterdown (CA); Naveen Chopra, Oakville (CA); Kurt I. Halfyard, Mississauga (CA)

(73) Assignee: Xerox Corporation, Norwalk, CT (US)

( * ) Notice: Subject to any disclaimer, the term of this patent is extended or adjusted under 35 U.S.C. 154(b) by 0 days.

(21) Appl. No.: 15/061,618

(22) Filed: Mar. 4, 2016

(65) Prior Publication Data
US 2017/0253757 A1 Sep. 7, 2017

(51) Int. Cl.
| | |
|---|---|
| *C09D 11/52* | (2014.01) |
| *H05K 1/09* | (2006.01) |
| *C09D 11/033* | (2014.01) |
| *C09D 11/037* | (2014.01) |
| *H05K 3/40* | (2006.01) |
| *H05K 3/12* | (2006.01) |

(52) U.S. Cl.
CPC ............ *C09D 11/52* (2013.01); *C09D 11/033* (2013.01); *C09D 11/037* (2013.01); *H05K 1/097* (2013.01); *H05K 3/40* (2013.01); *H05K 3/1275* (2013.01); *H05K 2201/0218* (2013.01)

(58) Field of Classification Search
CPC combination set(s) only.
See application file for complete search history.

(56) References Cited

U.S. PATENT DOCUMENTS

| | | | |
|---|---|---|---|
| 6,277,797 B1 * | 8/2001 | Glenn, Jr. ............... | A61K 8/26 510/130 |
| 7,270,694 B2 | 9/2007 | Li et al. | |
| 8,765,025 B2 | 7/2014 | Wu et al. | |
| 2011/0048171 A1 | 3/2011 | Enright et al. | |
| 2011/0059233 A1 | 3/2011 | Liu et al. | |
| 2012/0038716 A1 | 2/2012 | Hoerteis et al. | |
| 2012/0170241 A1 * | 7/2012 | Nakako ............... | C09D 11/52 361/783 |
| 2013/0029034 A1 | 1/2013 | Liu et al. | |
| 2014/0035995 A1 * | 2/2014 | Chou ............... | C09D 11/101 347/20 |
| 2014/0312284 A1 | 10/2014 | Liu et al. | |
| 2015/0191610 A1 * | 7/2015 | Matsushita ............ | H01B 1/22 174/257 |
| 2015/0225588 A1 * | 8/2015 | Iguchi ............... | B22F 9/24 106/31.92 |
| 2015/0240101 A1 | 8/2015 | Chopra et al. | |

OTHER PUBLICATIONS

Physical Properties of Asphalt Cement Binders, p. 12 (1995).*
Goredema et al., Nanosilver Ink Compositions Comprising Clay Additives, U.S. Appl. No. 14/573,191, filed Dec. 17, 2014, not yet published.
Goredema et al., Nanosilver Ink Compositions Comprising Polystyrene Additives, U.S. Appl. No. 14/594,746, filed Jan. 12, 2015, not yet published.
Farrugia et al., Anti-Bacterial Aqueous Ink Compositions Comprising Self-Dispersed Sulfonated Polyester-Silver Nanoparticle Composites, U.S. Appl. No. 14/706,097, filed May 7, 2015, not yet published.
Farrugia et al., Anti-Bacterial Aqueous Ink Compositions Comprising Metal Ion Composite Ionomer Resins, U.S. Appl. No. 14/807,127, filed Jul. 23, 2015, not yet published.
Song et al., Interlayers Composition for Electronic Printing, U.S. Appl. No. 14/981,419, filed Dec. 28, 2015, not yet published.
Canadian Examination Search Report issued in Canadian Application No. 2,958,956, dated Feb. 21, 2018, 4 pages.

* cited by examiner

*Primary Examiner* — Austin Murata
(74) *Attorney, Agent, or Firm* — Maylou J. Lavoie, Esq. LLC

(57) ABSTRACT

An ink composition including a metal nanoparticle; at least one aromatic hydrocarbon solvent, wherein the at least one aromatic hydrocarbon solvent is compatible with the metal nanoparticles; at least one aliphatic hydrocarbon solvent, wherein the at least one aliphatic hydrocarbon solvent is compatible with the metal nanoparticles; wherein the ink composition has a metal content of greater than about 45 percent by weight, based upon the total weight of the ink composition; wherein the ink composition has a viscosity of from about 5 to about 30 centipoise at a temperature of about 20 to about 30° C. A process for preparing the ink composition. A process for printing the ink composition comprising pneumatic aerosol printing.

19 Claims, 1 Drawing Sheet

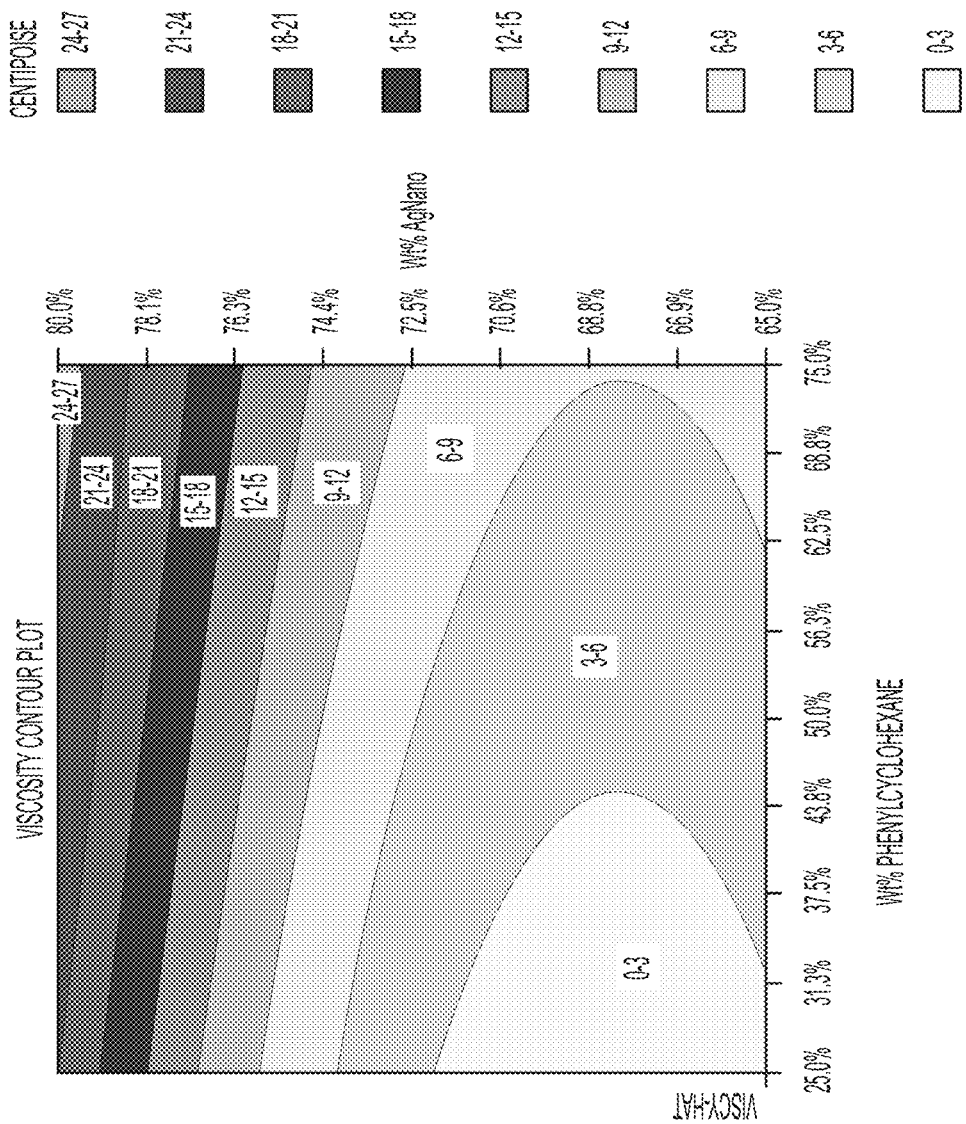

SILVER NANOPARTICLE INK

BACKGROUND

Disclosed herein is a silver nanoparticle ink composition. In embodiments, disclosed herein is a silver nanoparticle ink composition particularly suited for pneumatic aerosol printing applications.

Conductive inks are desired for fabricating conductive patterns for electronic device applications.

Xerox® Corporation has invented a nanosilver particle which is stabilized by an organoamine U.S. Pat. No. 8,765,025, which is hereby incorporated by reference herein in its entirety, describes a metal nanoparticle composition that includes an organic-stabilized metal nanoparticle and a solvent in which the solvent selected has the following Hansen solubility parameters: a dispersion parameter of about 16 MPa$^{0.5}$, or more, and a sum of a polarity parameter and a hydrogen bonding parameter of about 8.0 MPa$^{0.5}$ or less. U.S. Pat. No. 7,270,694, which is hereby incorporated by reference herein in its entirety, describes a process for preparing stabilized silver nanoparticles comprising reacting a silver compound with a reducing agent comprising a hydrazine compound by incrementally adding the silver compound to a first mixture comprising the reducing agent, a stabilizer comprising an organoamine, and a solvent.

U.S. patent application Ser. No. 13/866,704, which is hereby incorporated by reference herein in its entirety, describes stabilized metal-containing nanoparticles prepared by a first method comprising reacting a silver compound with a reducing agent comprising a hydrazine compound by incrementally adding the silver compound to a first mixture comprising the reducing agent, a stabilizer comprising an organoamine, and a solvent. U.S. patent application Ser. No. 14/188,284, which is hereby incorporated by reference herein in its entirety, describes conductive inks having a high silver content for gravure and flexographic printing and methods for producing such conductive inks.

Solution processable conducting materials including silver nanoparticle inks play an important role in electronic device integrations. Conductive inks that can be easily dispersed in suitable solvents and used to fabricate various conducting features in electronic devices such as electrodes and electrical interconnectors by low-cost solution deposition and patterning techniques including spin coating, dip coating, aerosol printing, and ink jet printing technologies are particularly desired. Aerosol printing, such as with a pneumatic atomizer, can be a low cost and efficient printing process for manufacturing large numbers of electronic devices such as RFID (Radio Frequency Identification) tags, antennas, electronic sensors, and the like.

However, pneumatic aerosol printing usually requires nanoparticle inks with a very high silver content, such as greater than about 60 weight percent, and a viscosity between about 8 and about 30 centipoise for high throughput and efficient printing. A problem with certain currently available nanoparticle conductive inks is the appearance of shortfalls in print performance as a result of changes in ink rheological properties over time, poor ink stability, and/or unpredictable performance characteristics. These issues can result in increased ink cost as ink batches may be rejected for not meeting performance requirements. Unpredictable shelf life can also occur even for certain ink batches initially passing quality checks.

Currently available conductive inks are suitable for their intended purposes. However a need remains for improved conductive inks. Further, a need remains for improved, stable conductive inks that meet the requirements for pneumatic aerosol printing processes for low cost electronic device applications.

The appropriate components and process aspects of the each of the foregoing U.S. Patents and Patent Publications may be selected for the present disclosure in embodiments thereof. Further, throughout this application, various publications, patents, and published patent applications are referred to by an identifying citation. The disclosures of the publications, patents, and published patent applications referenced in this application are hereby incorporated by reference into the present disclosure to more fully describe the state of the art to which this invention pertains.

SUMMARY

Described is an ink composition comprising a metal nanoparticle; at least one aromatic hydrocarbon solvent, wherein the at least one aromatic hydrocarbon solvent is compatible with the metal nanoparticles; at least one aliphatic hydrocarbon solvent, wherein the at least one aliphatic hydrocarbon solvent is compatible with the metal nanoparticles; wherein the ink composition has a metal content of greater than about 45 percent by weight, based upon the total weight of the ink composition; wherein the ink composition has a viscosity of from about 5 to about 30 centipoise at a temperature of about 20 to about 30° C.

Also described is a process for preparing an ink composition comprising combining a metal nanoparticle; at least one aromatic hydrocarbon solvent, wherein the at least one aromatic hydrocarbon solvent is compatible with the metal nanoparticles; and at least one aliphatic hydrocarbon solvent, wherein the at least one aliphatic hydrocarbon solvent is compatible with the metal nanoparticles; wherein the ink composition has a metal content of greater than about 45 percent by weight, based upon the total weight of the ink composition; wherein the ink composition has a viscosity of from about 5 to about 30 centipoise at a temperature of about 20 to about 30° C.

Also described is a process comprising providing a composition comprising a metal nanoparticle; at least one aromatic hydrocarbon solvent, wherein the at least one aromatic hydrocarbon solvent is compatible with the metal nanoparticles; at least one aliphatic hydrocarbon solvent, wherein the at least one aliphatic hydrocarbon solvent is compatible with the metal nanoparticles; wherein the ink composition has a metal content of greater than about 45 percent by weight, based upon the total weight of the ink composition; wherein the ink composition has a viscosity of from about 5 to about 30 centipoise at a temperature of about 20 to about 30° C.; depositing the ink composition onto a substrate to form deposited features; and optionally, heating the deposited features on the substrate to form conductive features on the substrate.

BRIEF DESCRIPTION OF THE DRAWINGS

FIG. 1 is a contour plot showing viscosity versus weight percent phenylcyclohexane and weight percent silver nanoparticles.

DETAILED DESCRIPTION

An ink composition comprising a metal nanoparticle and a combination of at least two solvents wherein at least one of the solvents is an aromatic hydrocarbon and at least one of the solvents is an aliphatic hydrocarbon, wherein the solvents are compatible with the metal nanoparticle.

As used herein, an aromatic hydrocarbon solvent that is compatible with the metal nanoparticles means a solvent that forms a stable dispersion, without aggregation or phase separation. Further, in embodiments, the metal nanoparticles do not precipitate out of the dispersion.

As used herein, an aliphatic hydrocarbon that is compatible with the metal nanoparticles means a solvent that forms a stable dispersion, without aggregation or phase separation. Further, in embodiments, the metal nanoparticles do not precipitate out of the dispersion.

In embodiments, an ink composition is provided comprising a metal nanoparticle; at least one aromatic hydrocarbon solvent, wherein the at least one aromatic hydrocarbon solvent is compatible with the metal nanoparticles; at least one aliphatic hydrocarbon solvent, wherein the at least one aliphatic hydrocarbon solvent is compatible with the metal nanoparticles; wherein the ink composition has a metal content of greater than about 45 percent by weight, based upon the total weight of the ink composition; wherein the ink composition has a viscosity of from about 5 to about 30 centipoise at a temperature of about 20 to about 30° C.

Metal Nanoparticles.

The ink composition herein comprises metal nanoparticles, in embodiments, silver nanoparticles. The metal nanoparticles may have any shape or geometry. In embodiments, the metal nanoparticles have a spherical shape. The metal nanoparticles can have a diameter in the submicron range. In embodiments, the metal nanoparticles have a volume average particle size of from about 0.5 to about 100 nanometers (nm), or from about 1.0 to about 50 nm, or from about 1.0 to about 20 nm. In embodiments, metal nanoparticles herein comprise nanoparticles of a size such that they can be sintered or annealed at low temperatures, such as, at a temperature of less than about 200° C., or less than about 100° C. In specific embodiments, the metal nanoparticles have a volume average particle size of from about 0.5 to about 50 nm, or from about 1 to about 20 nm, or from about 5.0 to about 10 nm. In other specific embodiments, the ratio of the volume average particle size to the number mean length diameter of the metal nanoparticles is less than about 1.3, or less than about 1.2, or less than about 1.1.

The characteristics of the metal nanoparticles may be determined by any suitable technique and apparatus. Volume average particle diameter may be measured by means of a measuring instrument such as a dynamic light scattering particle analyzer, operated in accordance with the manufacturer's instructions. Volume average particle diameter may be derived, for example, by means of a measuring instrument such as a Malvern Instruments Zetasizer® Nano S, operated in accordance with the manufacturer's instructions.

In embodiments, the metal nanoparticle is selected from the group consisting of silver, cobalt, copper, nickel, gold, palladium, and combinations thereof. In embodiments, the metal nanoparticle is a silver nanoparticle.

The silver nanoparticles may be elemental silver, a silver alloy, or a combination thereof. In embodiments, the silver nanoparticles may be a base material coated or plated with pure silver, a silver alloy, or a silver compound. For example, the base material may be copper flakes with silver plating. The silver alloy may be formed from at least one metal selected from Au, Cu, Ni, Co, Pd, Pt, Ti, V, Mn, Fe, Cr, Zr, Nb, Mo, W, Ru, Cd, Ta, Re, Os, Ir, Al, Ga, Ge, In, Sn, Sb, Pb, Bi, Si, As, Hg, Sm, Eu, Th, Mg, Ca, Sr, and Ba, although not limited.

In embodiments, the silver compound may include either or both of (i) one or more other metals and (ii) one or more non-metals. Suitable other metals include, for example, Al, Au, Pt, Pd, Cu, Co, Cr, In, and Ni, particularly the transition metals, for example, Au, Pt, Pd, Cu, Cr, Ni, and mixtures thereof. Exemplary metal composites are Au—Ag, Ag—Cu, Au—Ag—Cu, and Au—Ag—Pd. Suitable non-metals in the metal composite include, for example, Si, C, and Ge. In certain embodiments the silver nanoparticles are composed of elemental silver. In embodiments, the silver particles can be selected from those described in U.S. patent application Ser. No. 14/188,284, which is hereby incorporated by reference herein in its entirety.

The silver nanoparticles can be prepared as described in U.S. Patent Application Publication 2013/0029034, which is hereby incorporated by reference herein in its entirety. In embodiments, a process for producing silver nanoparticles includes receiving a first mixture comprising a silver salt, an organoamine, a first solvent, and a second solvent; and reacting the first mixture with a reducing agent solution to form organoamine-stabilized silver nanoparticles. The polarity index of the first solvent is less than 3.0, and the polarity index of the second solvent is higher than 3.0. The nanoparticles are more dispersible or soluble in the first solvent. For further detail, see U.S. Patent Application Publication 2013/0029034.

The silver nanoparticles can be stabilized metal-containing nanoparticles prepared as described in U.S. Pat. No. 7,270,694, which is hereby incorporated by reference herein in its entirety. In embodiments, the silver nanoparticles can be prepared by a process comprising reacting a silver compound with a reducing agent comprising a hydrazine compound in the presence of a thermally removable stabilizer in a reaction mixture comprising the silver compound, the reducing agent, the stabilizer, and an optional solvent, to form a plurality of silver-containing nanoparticles with molecules of the stabilizer on the surface of the silver-containing nanoparticles. For further detail, see U.S. Pat. No. 7,270,694.

In embodiments, the metal nanoparticle is a silver nanoparticle having a stabilizer associated with a surface of the silver nanoparticle. The silver nanoparticle can, in embodiments, be selected from the group consisting of silver, silver-copper composite, silver-gold-copper composite, silver-gold-palladium composite, and combinations thereof. In embodiments, the stabilizer is an organoamine stabilizer. In embodiments, the organoamine stabilizer can be selected from the group consisting of nonylamine, decylamine, hexadecylamine, undecylamine, dodecylamine, tridecylamine, tetradecylamine, and combinations thereof. For further detail, see U.S. Pat. No. 8,765,025, which is hereby incorporated by reference herein in its entirety.

The metal nanoparticles can be present in the ink composition in any suitable or desired amount. In embodiments, the metal nanoparticles can be present in the ink composition so as to provide the ink composition with a metal content of greater than 45 percent by weight, or greater than 60 percent by weight, based on the total weight of the ink composition. In embodiments, the metal nanoparticle is present in the ink composition in an amount of from about greater than about 45 percent to about 80 percent by weight, or greater than about 45 percent to about 70 percent by weight, based on the total weight of the ink composition. In embodiments, the metal nanoparticle is present in the ink composition in an amount of from about greater than about 60 percent to about 80 percent by weight, or greater than about 60 percent to about 70 percent by weight, based on the total weight of the ink composition. In embodiments, the metal nanoparticle is present in the ink composition in an amount of from greater than 45 percent to about 80 percent by weight, or greater than 45 percent to about 70 percent by weight, based on the total weight of the ink composition. In embodiments, the metal nanoparticle is present in the ink composition in an amount of greater than 60 percent to about 80 percent by weight, or greater than 60 percent to about 70 percent by weight, based on the total weight of the ink composition.

In certain embodiments, the metal nanoparticle is a silver nanoparticle present in the ink composition so as to provide the ink composition with a silver metal content of greater than 45 percent by weight, or greater than 60 percent by weight, based on the total weight of the ink composition. In embodiments, the silver nanoparticle is present in the ink composition in an amount of from about greater than about 45 percent to about 80 percent by weight, or greater than about 45 percent to about 70 percent by weight, based on the total weight of the ink composition. In embodiments, the silver nanoparticle is present in the ink composition in an amount of from about greater than about 60 percent to about 80 percent by weight, or greater than about 60 percent to about 70 percent by weight, based on the total weight of the ink composition. In embodiments, the silver nanoparticle is present in the ink composition in an amount of from greater than 45 percent to about 80 percent by weight, or greater than 45 percent to about 70 percent by weight, based on the total weight of the ink composition. In embodiments, the silver nanoparticle is present in the ink composition in an amount of greater than 60 percent to about 80 percent by weight, or greater than 60 percent to about 70 percent by weight, based on the total weight of the ink composition.

Solvents.

The ink compositions contain a particular combination of aromatic hydrocarbon solvent and aliphatic hydrocarbon solvent, wherein the solvents are compatible with the metal nanoparticle, so as to provide the ink composition with certain characteristics favorable to pneumatic aerosol printing.

An aerosol printer is described, for example, in U.S. Patent Publication 2012/0038716, which is hereby incorporated by reference herein in its entirety. U.S. Patent Publication 2012/0038716 describes in the Abstract thereof an aerosol printer which has at least one atomizing chamber and at least one printing head with at least one nozzle, these being connected directly or via connection lines. Furthermore, the aerosol printer has process gas—, transport gas— and focusing gas lines. An aerosol printer can be characterized by the method of creating the aerosol. For example, an ultrasonic aerosol printer creates the aerosol via ultrasonic vibration and a pneumatic aerosol printer creates the aerosol mist using a pipe disposed in the ink chamber in direct contact with the ink.

The at least one aromatic hydrocarbon solvent can be any suitable or desired aromatic hydrocarbon solvent or combination of aromatic hydrocarbon solvents provided that the aromatic hydrocarbon solvent or solvents is compatible with the metal nanoparticle. Compatibility with the metal nanoparticle means compatibility as described hereinabove.

In embodiments, the at least one aromatic hydrocarbon solvent is selected from the group consisting of phenylcyclohexane, toluene, mesitylene, m-xylene, ethylbenzene, and combinations thereof.

The at least one aliphatic hydrocarbon solvent can be any suitable or desired aliphatic hydrocarbon solvent or combination of aliphatic hydrocarbon solvents provided that the aliphatic hydrocarbon solvent or solvents is compatible with the metal nanoparticle. Compatibility with the metal nanoparticle means compatibility as described hereinabove.

In embodiments, the at least one aliphatic hydrocarbon solvent is selected from the group consisting of ethylcyclohexane, methylcyclohexane, terpineol, bicyclohexyl, decahydronaphthalene, cyclohexane, and combinations thereof.

In specific embodiments, the ink composition herein comprises a silver nanoparticle; at least one aromatic hydrocarbon solvent that is compatible with the silver nanoparticle; and at least one aliphatic hydrocarbon solvent that is compatible with the silver nanoparticle. In more specific embodiments, the ink composition comprises a silver nanoparticle; at least one aromatic hydrocarbon solvent selected from the group consisting of phenylcyclohexane, toluene, mesitylene, m-xylene, ethylbenzene, and combinations thereof; and at least one aliphatic hydrocarbon solvent is ethylcyclohexane, methylcyclohexane, terpineol, bicyclohexyl, decahydronaphthalene, cyclohexane, and combinations thereof.

In embodiments, the selected solvent is terpineol, including the isomeric forms of alpha-, beta-, gamma- and 4-terpineol, or mixtures thereof, including mixtures of alpha-, beta- and gamma-terpineol or other relatively higher viscosity solvents which enables lower amounts of metal nanoparticle, such as 45 percent by weight based on the total weight of the ink composition, which enables achievement of printed line thicknesses of about 10 microns where desired. By low viscosity solvent, it is meant that the solvent has a viscosity of from about 0.5 to about 10 centipoise at a temperature of from about 20 to about 30° C.

Preparing the Ink Composition.

The ink compositions can be prepared by any suitable process, such as by simple mixing of the ingredients. One process entails mixing all of the ink ingredients together and filtering the mixture to obtain an ink. Inks can be prepared by mixing the ingredients, heating if desired, and filtering, followed by adding any desired additional additives to the mixture and mixing at room temperature with moderate shaking until a homogeneous mixture is obtained, in embodiments from about 5 to about 10 minutes, up to about 24 hours. Alternatively, the optional ink additives can be mixed with the other ink ingredients during the ink preparation process, which takes place according to any desired procedure, such as by mixing all the ingredients, heating if desired, and filtering.

In embodiments, a process for preparing an ink composition herein comprises combining a metal nanoparticle; at least one aromatic hydrocarbon solvent, wherein the at least one aromatic hydrocarbon solvent is compatible with the metal nanoparticles; and at least one aliphatic hydrocarbon solvent, wherein the at least one aliphatic hydrocarbon solvent is compatible with the metal nanoparticles; wherein the ink composition has a metal content of greater than about 60 percent by weight, based upon the total weight of the ink composition; wherein the ink composition has a viscosity of from about 5 to about 30 centipoise at a temperature of about 20 to about 30° C. In embodiments, wherein the metal nanoparticle is a silver nanoparticle or combination of silver nanoparticles. In embodiments, wherein the combination of solvents comprises at least one aromatic hydrocarbon solvent selected from the group consisting of phenylcyclohexane, toluene, mesitylene, m-xylene, ethylbenzene, and combinations thereof; and at least one aliphatic hydrocarbon solvent is ethylcyclohexane, methylcyclohexane, terpineol, bicyclohexyl, decahydronaphthalene, cyclohexane, and combinations thereof.

Shear index can be measured by any suitable or desired method as known in the art, such as with an Ares G2 Rheometer from TA Instruments using a 50 millimeter cone, 0.053 microns gap, using a rate sweep run from 1 to 400 s$^{-1}$ and 400 to 4 s$^{-1}$ at 25° C.

In embodiments, the ink compositions herein have a shear index of below 1.10. In embodiments, the ink compositions have a shear index of from about 0.9 to below 1.10.

Viscosity can be measured by any suitable or desired method as known in the art, such as with an Ares G2 Rheometer from TA Instruments. Viscosity data can be obtained, for example, at 25° C. on an Ares G2 Rheometer from TA Instruments using a 50 millimeter cone, 0.053 microns gap.

In embodiments, the ink composition is a high-viscosity composition. In embodiments, the ink composition disclosed herein has a viscosity of from about 8 to about 100, or from about 10 to about 80, or from about 15 to about 60 centipoise at a temperature of about 25° C. In further embodiments, the ink composition has a viscosity of from about 5 to about 30, or from about 8 to about 30, or from about 9 to about 15, or from about 10 to about 15, or from about 10 to about 13 centipoise at a temperature of about 25° C. In certain embodiments, the ink has a viscosity of from about 5 to about 30 centipoise at a temperature in the range of from about 20 to about 30° C. and shear rate of from about 40 to about 400 s$^{-1}$.

In embodiments, the ink composition has a viscosity of from about 5 to about 30 centipoise at a temperature of about 20 to about 30° C.

The metal nanoparticle ink compositions can be employed in any suitable or desired printing process. A process herein comprises providing the present ink composition; depositing the ink composition onto a substrate to form deposited features, an ink image, or a combination thereof. The printing process can comprise a pneumatic aerosol printing process. In embodiments, the process further comprises heating the deposited features on the substrate to form conductive features on the substrate.

In embodiments, a process herein comprises providing a composition comprising a metal nanoparticle; at least one aromatic hydrocarbon solvent, wherein the at least one aromatic hydrocarbon solvent is compatible with the metal nanoparticles; at least one aliphatic hydrocarbon solvent, wherein the at least one aliphatic hydrocarbon solvent is compatible with the metal nanoparticles; wherein the ink composition has a metal content of greater than about 60 percent by weight, based upon the total weight of the ink composition; wherein the ink composition has a viscosity of from about 5 to about 30 centipoise at a temperature of about 20 to about 30° C.; depositing the ink composition onto a substrate to form deposited features; and optionally, heating the deposited features on the substrate to form conductive features on the substrate. In a specific embodiment, depositing the ink composition comprises depositing using pneumatic aerosol printing.

The substrate upon which the metal features are deposited may be any suitable substrate including silicon, glass plate, plastic film, sheet, fabric, or paper. For structurally flexible devices, plastic substrates such as polyester, polycarbonate, polyimide sheets, and the like, may be used. The thickness of the substrate can be any suitable thickness such as about 10 micrometers to over 10 millimeters with an exemplary thickness being from about 50 micrometers to about 2 millimeters, especially for a flexible plastic substrate, and from about 0.4 to about 10 millimeters for a rigid substrate such as glass or silicon.

Heating the deposited ink composition can be to any suitable or desired temperature, such as to from about 70° C. to about 200° C., or any temperature sufficient to induce the metal nanoparticles to "anneal" and thus form an electrically conductive layer which is suitable for use as an electrically conductive element in electronic devices. The heating temperature is one that does not cause adverse changes in the properties of previously deposited layers or the substrate. In embodiments, use of low heating temperatures allows use of low cost plastic substrates which have an annealing temperature of below 200° C., in embodiments, below 150° C.

The heating can be for any suitable or desired time, such as from about 0.01 second to about 10 hours. In embodiments, heating can be performed under vacuum. The heating can be performed in air, in an inert atmosphere, for example under nitrogen or argon, or in a reducing atmosphere, for example, under nitrogen containing from about 1 to about 20 percent by volume hydrogen. The heating can also be performed under normal atmospheric pressure or at a reduced pressure of, for example, about 1000 mbars to about 0.01 mbars.

Heating encompasses any technique that can impart sufficient energy to the heated material or substrate to (1) anneal the metal nanoparticles and/or (2) remove the optional stabilizer from the metal nanoparticles. Examples of heating techniques include thermal heating (for example, a hot plate, an oven, and a burner), infra-red ("IR") radiation, laser beam, flash light, microwave radiation, or ultraviolet ("UV") radiation, or a combination thereof.

In embodiments, after heating, the resulting electrically conductive line has a thickness ranging from about 0.5 to about 20 micrometers, or from about 1 to about 10 micrometers. In certain embodiments, after heating, the resulting electrically conductive line has a thickness of from about 2 to about 7 micrometers.

In embodiments, the ink composition herein has a bulk conductivity that is more than about 50,000 S/cm. The conductivity of the resulting metal element produced by heating the deposited nanosilver ink composition is, for example, more than about 100 Siemens/centimeter (S/cm), more than about 1,000 S/cm, more than about 2,000 S/cm, more than about 5,000 S/cm, more than about 10,000 S/cm, or more than about 50,000 S/cm.

Average conductivity is 20,000 S/cm, bulk means pure silver, so ⅓ bulk means having ⅓ the conductivity (per unit) as a piece of silver. In certain embodiments, the ink composition provides a printed image having a bulk conductivity after heating of from about 75,000 to about 250,000 S/cm at a printed image line thickness of from about 1 to about 10 micrometers, or from about 75,000 to about 200,000 S/cm at a printed image line thickness of from about 1 to about 10 micrometers.

The resulting elements can be used for any suitable or desired application, such as for electrodes, conductive pads, interconnects, conductive lines, conductive tracks, and the like, in electronic devices such as thin film transistors, organic light emitting diodes, RFID tags, photovoltaic displays, printed antenna, and other electronic devices which required conductive elements or components.

EXAMPLES

The following Examples are being submitted to further define various species of the present disclosure. These Examples are intended to be illustrative only and are not intended to limit the scope of the present disclosure. Also, parts and percentages are by weight unless otherwise indicated.

Ashing was determined by burning the sample at about 800° C. and measuring the remaining weight compared to initial weight.

Particle size diameters were measured using a Malvern Instruments Zetasizer® Nano S at 20° C. in accordance with ASTM Designation E 2490-09, Standard Guide for Measurement of Particle Size Distribution of Nanomaterials in Suspension by Photon Correlation Spectroscopy (PCS). A useful particle size metric, among others, to describe the overall average particle size of a given colloidal dispersion is the Z-average, or cumulants mean, and represents the intensity based harmonic mean of the weighted average particle diameter and is calculated in the following way:

$$D_z = \Sigma_{i=1}^{n} S_i / \Sigma_{i=1}^{n} \left( \frac{S_i}{D_i} \right)$$

such as where $D_z$ represents the Z-average diameter, $S_i$ is the scatter intensity of particle i and $D_i$ is the particle diameter of particle i. D(1,0), or the number mean length diameter, is derived from the number-based data and is derived in the following way:

$$D(1, 0) = \sum_{i=1}^{n} \frac{d_i}{n}$$

such as where $d_i$ is the particle diameter of particle i. Each of the particle size metrics were the mean average results of 5 separate measurements, each measurement consisting of the mean average of 11 runs during the course of the measurement cycle. It is advantageous for the Z-average and D(1,0) metrics to be as close to one another as possible such that Z-average/D(1,0) is less than about 3, such as less than about 2 such as less than 1.5. The lower the Z-average/D (1,0) value, the lower the contributing effects of scatter from larger agglomerated or aggregated particles present in the dispersion or ink which ultimately leads to better stability and performance in pneumatic aerosol printing.

Viscosity and Shear thinning index data were acquired from shear rate sweep measurements of inks on an RFS 3 Rheometer from TA Instruments (Previously Rheometric Scientific). The viscosity data were obtained at 25° C. on an RFS 3 Rheometer from TA Instruments (Previously Rheometric Scientific) using a 40 millimeter cone, 0.028 microns gap. Rate sweeps were run from 1 to 400 and 400 to 1 $s^{-1}$.

Conductivity lines for Comparative Ink Example 1 and Ink Examples 2-3 were printed as follows.

Pneumatic Aerosol Printing (Optomec® Inc. "SPRINT" system) was performed using a 1 mm round nozzle located 3 mm from the substrate surface. Atomizing gas (nitrogen) flows can range from 500-1600 SCCM, Exhaust gas flow can range from 500-1600 SCCM, and sheath gas flow can range from 300-700 SCCM from fixed print head. The substrate process speed can range from 1 mm/sec to 20 mm/sec. The prints were sintered in an oven at 130° C. for 60 minutes after a 30 minute 'solvent-out-gassing' delay at room temperature and atmospheric pressure.

Resistance measurements on the printed conductive lines were taken at ambient room temperature (about 21 to about 23° C.) using a Keithley® 236 Source Measurement Unit 4-Point Probe (EPA-2D Probe tips), with 100 mA applied current, measuring output voltage across approximately 1.27 cm distance. The thickness (pile height) and width of these lines was measured using a Dektak Profilometer® and resistivity and conductivity of the samples was then calculated.

Comparative Example 1

Silver nanoparticle ink comprising two aromatic solvents for Pneumatic Aerosol printing was prepared as follows. In a glass bottle, 73.2 grams dry silver nanoparticles were dissolved in a mixture of 8.93 grams Toluene and 17.87 grams Phenylcyclohexane. The bottle was sealed and placed on an orbital shaker for 2 hours, then placed on a "Roll and Tilt" Mixer for 22 additional hours. To filter the ink, a 1 μm pore, glass-fiber syringe filter was used with a polypropylene syringe. The resulting silver nanoparticle ink contained 65.40 weight percent Silver by Ashing, a viscosity of 12.61 centipoise (cps) and shear index of 1.21. After printing, 2-pt probe measured average conductivity of $8.84 \times 10^4$ S/cm at thicknesses of 1.5 to 4.0 μm.

Example 2

Silver nanoparticle ink for Pneumatic Aerosol printing was prepared as follows. In a glass bottle, 29.4 grams of dry silver nanoparticles were dissolved in a mixture of 7.07 grams of Phenylcyclohexane and 3.53 grams of Ethylcyclohexane. The bottle was sealed and placed on an orbital shaker for 2 hours, then placed on a "Roll and Tilt" Mixer for 22 additional hours. To filter the ink, a 1 μm pore, glass-fiber syringe filter was used with a polypropylene syringe. The resulting silver nanoparticle ink contained 64.00 weight percent Silver by Ashing, a viscosity of 11.65 cps and shear index of 1.03. After printing, 2-pt probe measured average conductivity of $1.02 \times 10^5$ S/cm at thicknesses of 1.0 to 7.0 μm.

Example 3

Silver nanoparticle ink for Pneumatic Aerosol printing was prepared as follows. In a glass bottle, 36.60 grams of dry silver nanoparticles were dissolved in a mixture of 2.01 grams of Decahydronaphthalene and 10.72 grams of Phenylcyclohexane, and 0.67 grams of Hexadecane. The bottle was sealed and placed on an orbital shaker for 2 hours, then placed on a "Roll and Tilt" Mixer for 22 additional hours. To filter the ink, a 1 μm pore, glass-fiber syringe filter was used with a polypropylene syringe. The resulting silver nanoparticle ink contained 66.33 weight percent Silver by Ashing, a viscosity of 18.63 cps and shear index of 1.04. After printing, 2-pt probe measured average conductivity of $1.16 \times 10^5$ S/cm at thicknesses 1.1 to 5.4 μm.

Prints were prepared using Comparative Ink Example 1 and Ink Examples 2 to 3 sing the Optomec® Pneumatic Aerosol Printer, 3 mm slot Nozzle, 1 mm gap, 600 SCCM Sheath Gas, 1500 SCCM Atomizer Gas, 1200 SCCM Exhaust Gas. The conductivity data for the printed ink samples is shown in Table 1.

TABLE 1

| Example | Value |
|---|---|
| Comparative Example 1 | |
| Thickness (Microns) | 2.6 |
| Conductivity (S/cm) | $8.84 \times 10^4$ |
| Example 2 | |
| Thickness (Microns) | 2.7 |
| Conductivity (S/cm) | $1.02 \times 10^5$ |
| Example 3 | |
| Thickness (Microns) | 2.7 |
| Conductivity (S/cm) | $1.16 \times 10^5$ |

Examples 4-23 were prepared by combining silver nanoparticles and solvent systems as provided in Tables 2 and 3 where percent is by weight. For each example, the solvents were added to a 4 Dram pop top vial, with swirling, then the dry silver nanoparticles were added, followed by Orbital mixing at 350 RPM.

Dec=Decahydronaphthalene (Decalin)

BCHex=Bicyclohexane

EtCHex=Ethylcyclohexane

PhCHex=Phenylcyclohexane

LB=Low Boiling Point Solvent

HB=High Boiling Point Solvent

TABLE 2

| Example | Solvent System | LB % | HB % | Silver Nanoparticle % | Silver % |
|---|---|---|---|---|---|
| 4 | Dec:BCHex | 67 | 33 | 60 | 52.4 |
| 5 | EtChex:PhChex | 75 | 25 | 65 | 56.8 |
| 6 | EtChex:PhChex | 75 | 25 | 70 | 61.2 |
| 7 | EtChex:PhChex | 75 | 25 | 75 | 65.6 |
| 8 | EtChex:PhChex | 25 | 75 | 65 | 56.8 |
| 9 | EtChex:PhChex | 25 | 75 | 70 | 61.2 |
| 10 | EtChex:PhChex | 25 | 75 | 75 | 65.6 |
| 11 | EtChex:PhChex | 50 | 50 | 65 | 56.8 |
| 12 | EtChex:PhChex | 50 | 50 | 70 | 61.2 |
| 13 | EtChex:PhChex | 50 | 50 | 75 | 65.6 |

TABLE 3

| Example | Solvent System | LB % | HB % | Silver Nanoparticle % | Silver % |
|---|---|---|---|---|---|
| 14 | Dec:BCHex | 50 | 50 | 50 | 43.7 |
| 15 | EtChex:PhChex | 25 | 80 | 80 | 69.9 |
| 16 | EtChex:PhChex | 50 | 80 | 80 | 69.9 |
| 17 | EtChex:PhChex | 75 | 80 | 80 | 69.9 |
| 18 | EtChex:PhChex | 25 | 85 | 85 | 74.3 |
| 19 | EtChex:PhChex | 50 | 85 | 85 | 74.3 |
| 20 | EtChex:PhChex | 75 | 25 | 85 | 74.3 |
| 21 | EtChex:PhChex | 25 | 77.5 | 77.5 | 67.7 |
| 22 | EtChex:PhChex | 50 | 77.5 | 77.5 | 67.7 |
| 23 | EtChex:PhChex | 75 | 77.5 | 77.5 | 67.7 |

Z-Average particle size (nm=nanometers), D[1,0] particle size (nm), and LTH viscosity (40-400), mPas·s are shown in Tables 4 and 5 for Examples 4-23. FIG. 1 is a contour plot showing viscosity versus weight percent phenylcyclohexane and weight percent silver nanoparticles.

TABLE 4

| Example | Z-Average (nm) | D[1, 0] (nm) | LTH Visc. (40-400) (mPa · s) | LTH Shear Index (40-400) |
|---|---|---|---|---|
| 4 | 9.70 | 6.43 | 4.04 | 0.99 |
| 5 | 17.50 | 9.72 | 2.90 | 1.12 |
| 6 | 34.60 | 12.05 | 4.17 | 1.01 |
| 7 | 11.20 | 7.07 | 7.57 | 1.02 |
| 8 | 18.60 | 7.26 | 5.49 | 1.07 |
| 9 | 26.10 | 9.06 | 7.38 | 1.00 |
| 10 | 15.60 | 7.10 | 11.65 | 1.01 |
| 11 | 14.30 | 8.12 | 3.86 | 1.04 |
| 12 | 10.10 | 6.47 | 5.50 | 1.04 |
| 13 | 11.00 | 6.60 | 8.66 | 1.02 |

TABLE 5

| Example | Z-Average (nm) | D[1, 0] (nm) | LTH Visc. (40-400) (mPa · s) | LTH Shear Index (40-400) |
|---|---|---|---|---|
| 14 | 11.50 | 7.13 | 2.06 | 1.07 |
| 15 | 10.5 | 7.03 | 29.38 | 1.01 |
| 16 | 13.9 | 8.16 | 23.60 | 0.99 |
| 17 | 9.4 | 6.36 | 21.01 | 1.07 |
| 18 | 30.2 | 7.26 | 185.95 | 0.98 |
| 19 | 10.8 | 6.67 | 206.59 | 1.08 |
| 20 | 9.40 | 6.19 | 302.68 | 3.58 |
| 21 | 24.60 | 9.89 | 18.62 | 1.02 |
| 22 | 11.2 | 6.70 | 14.23 | 1.00 |
| 23 | 20.3 | 8.41 | 11.13 | 1.00 |

Examples 18 through 20 inclusive show a relatively high viscosity compared to other examples in Tables 4 and 5 and can only be aerosolized for a short period of time. The other examples have a viscosity range between about 5 and about 30 centipoise with a LTH Shear Index (40-400) range between about 1 and about 1.1 and thus can be aerosolized for longer periods of time.

Z-Average particle size in nanometers as measured with Malvern Instruments Zetasizer® Nano S, operated in accordance with the manufacturer's instructions.

D[1,0]=Number mean particle diameter.

LTH=Low to High=viscosity, mean of the ascending shear viscosity values from 40 to 400 $s^{-1}$.

LTH Shear Index (40-400)=viscosity at 40 $s^{-1}$/viscosity at 400 $s^{-1}$ from the ascending shear rate sweep test.

It will be appreciated that various of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims. Unless specifically recited in a claim, steps or components of claims should not be implied or imported from the specification or any other claims as to any particular order, number, position, size, shape, angle, color, or material.

The invention claimed is:

1. An ink composition comprising:

a metal nanoparticle;

at least one aromatic hydrocarbon solvent, wherein the at least one aromatic hydrocarbon solvent is compatible with the metal nanoparticles;

at least one aliphatic hydrocarbon solvent, wherein the at least one aliphatic hydrocarbon solvent is compatible with the metal nanoparticles;
wherein the at least one aromatic hydrocarbon solvent is phenylcyclohexane; and
wherein the at least one aliphatic hydrocarbon solvent is ethylcyclohexane;
wherein the ink composition has a metal content of greater than about 45 percent by weight, based upon the total weight of the ink composition;
wherein the ink composition has a viscosity of from about 5 to about 30 centipoise at a temperature of about 20 to about 30° C.

2. The ink composition of claim 1, wherein the metal nanoparticle is selected from the group consisting of silver, cobalt, copper, nickel, gold, palladium, and combinations thereof.

3. The ink composition of claim 1, wherein the metal nanoparticle is present in an amount of from about greater than about 45 to about 80 percent by weight, based upon the total weight of the ink composition.

4. The ink composition of claim 1, wherein the metal nanoparticle is a silver nanoparticle; and
wherein the silver nanoparticle is present in an amount of from about greater than about 45 to about 80 percent by weight, based upon the total weight of the ink composition.

5. The ink composition of claim 1, wherein in an ascending shear rate sweep test using a rate sweep run from 1 to 400 $s^{-1}$ and 400 to 4 $s^{-1}$ at 25° C., a shear index (40-400)= viscosity at 40 $s^{-1}$/viscosity at 400 $s^{-1}$;
the ink composition has a shear index of below 1.10.

6. The ink composition of claim 1, wherein in an ascending shear rate sweep test using a rate sweep run from 1 to 400 $s^{-1}$ and 400 to 4 $s^{-1}$ at 25° C., a shear index (40-400)= viscosity at 40 $s^{-1}$/ viscosity at 400 $s^{-1}$;
the ink composition has a shear index of from about 0.9 to below 1.10.

7. The ink composition of claim 1, wherein the ink composition provides a printed image having a bulk conductivity after heating of from about 75,000 to about 250,000 S/cm at a printed image line thickness of from about 1 to about 10 micrometers.

8. The ink composition of claim 1, wherein the metal nanoparticle is a silver nanoparticle.

9. The ink composition of claim 8, wherein in an ascending shear rate sweep test using a rate sweep run from 1 to 400 $s^{-1}$ and 400 to 4 $s^{-1}$ at 25° C., a shear index (40-400)= viscosity at 40 $s^{-1}$/viscosity at 400 $s^{-1}$;
the ink composition has a shear index of from about 0.9 to below 1.10.

10. The ink composition of claim 8, wherein the ink composition provides a printed image having a bulk conductivity of from about 75,000 to about 250,000 S/cm at a printed image line thickness of from about 1 to about 10 micrometers.

11. The ink composition of claim 1, wherein the ink composition comprises an aerosol printing ink composition.

12. The ink composition of claim 1, wherein the metal nanoparticle is a silver nanoparticle; and wherein the silver nanoparticle is present in an amount of about 80 percent by weight, based upon the total weight of the ink composition.

13. The ink composition of claim 1, wherein the metal nanoparticle is a silver nanoparticle; and wherein the silver nanoparticle is present in an amount of about 85 percent by weight, based upon the total weight of the ink composition.

14. The ink composition of claim 1, wherein the metal nanoparticle has a Z-average particle size and a D(1,0) number mean length diameter; and
wherein Z-average/D(1,0) is less than about 3.

15. A process for preparing an ink composition comprising:
combining a metal nanoparticle;
at least one aromatic hydrocarbon solvent, wherein the at least one aromatic hydrocarbon solvent is compatible with the metal nanoparticles; and
at least one aliphatic hydrocarbon solvent, wherein the at least one aliphatic hydrocarbon solvent is compatible with the metal nanoparticles;
wherein the at least one aromatic hydrocarbon solvent is phenylcyclohexane; and
wherein the at least one aliphatic hydrocarbon solvent is ethylcyclohexane;
wherein the ink composition has a metal content of greater than about 45 percent by weight, based upon the total weight of the ink composition;
wherein the ink composition has a viscosity of from about 5 to about 30 centipoise at a temperature of about 20 to about 30° C.

16. The process of claim 15, wherein the metal nanoparticle is a silver nanoparticle.

17. A process comprising:
providing a composition comprising a metal nanoparticle; at least one aromatic hydrocarbon solvent, wherein the at least one aromatic hydrocarbon solvent is compatible with the metal nanoparticles; at least one aliphatic hydrocarbon solvent, wherein the at least one aliphatic hydrocarbon solvent is compatible with the metal nanoparticles; wherein the at least one aromatic hydrocarbon solvent is phenylcyclohexane; and wherein the at least one aliphatic hydrocarbon solvent is ethylcyclohexane; wherein the ink composition has a metal content of greater than about 45 percent by weight, based upon the total weight of the ink composition; wherein the ink composition has a viscosity of from about 5 to about 30 centipoise at a temperature of about 20 to about 30° C.;
depositing the ink composition onto a substrate to form deposited features; and
optionally, heating the deposited features on the substrate to form conductive features on the substrate.

18. The process of claim 17, wherein depositing the ink composition comprises depositing using pneumatic aerosol printing.

19. The process of claim 17, wherein the metal nanoparticle is a silver nanoparticle.

* * * * *